(12) United States Patent
Lin et al.

(10) Patent No.: US 11,942,475 B2
(45) Date of Patent: Mar. 26, 2024

(54) HIGH VOLTAGE TRANSISTOR STRUCTURE

(71) Applicant: TAIWAN SEMICONDUCTOR MANUFACTURING CO., LTD., Hsinchu (TW)

(72) Inventors: Meng-Han Lin, Hsinchu (TW); Wen-Tuo Huang, Tainan (TW); Yong-Shiuan Tsair, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/657,396

(22) Filed: Oct. 18, 2019

(65) Prior Publication Data

US 2021/0118876 A1    Apr. 22, 2021

(51) Int. Cl.
*H01L 27/088*      (2006.01)
*H01L 21/02*       (2006.01)
(Continued)

(52) U.S. Cl.
CPC .... *H01L 27/0886* (2013.01); *H01L 21/02164* (2013.01); *H01L 21/02532* (2013.01); *H01L 21/02595* (2013.01); *H01L 21/28052* (2013.01); *H01L 21/823431* (2013.01); *H01L 21/823443* (2013.01); *H01L 21/823456* (2013.01); *H01L 21/823468* (2013.01); *H01L 27/088* (2013.01);
(Continued)

(58) Field of Classification Search
None
See application file for complete search history.

(56) References Cited

U.S. PATENT DOCUMENTS 5,268,590 A * 12/1993 Pfiester ............ H01L 29/665
                                                     257/377
9,129,856 B2 * 9/2015 Xia .................. H10B 41/43
(Continued)

FOREIGN PATENT DOCUMENTS

| CN | 105097510 B | 3/2019 |
|----|-------------|--------|
| TW | 201232628 A | 8/2012 |

(Continued)

*Primary Examiner* — Nishath Yasmeen
(74) *Attorney, Agent, or Firm* — Sterne, Kessler, Goldstein & Fox P.L.L.C.

(57) ABSTRACT

The present disclosure describes a method for forming (i) input/output (I/O) fin field effect transistors (FET) with polysilicon gate electrodes and silicon oxide gate dielectrics integrated and (ii) non-I/O FETs with metal gate electrodes and high-k gate dielectrics. The method includes depositing a silicon oxide layer on a first region of a semiconductor substrate and a high-k dielectric layer on a second region of the semiconductor substrate; depositing a polysilicon layer on the silicon oxide and high-k dielectric layers; patterning the polysilicon layer to form a first polysilicon gate electrode structure on the silicon oxide layer and a second polysilicon gate electrode structure on the high-k dielectric layer, where the first polysilicon gate electrode structure is wider than the second polysilicon gate electrode structure and narrower than the silicon oxide layer. The method further includes replacing the second polysilicon gate electrode structure with a metal gate electrode structure.

20 Claims, 11 Drawing Sheets

(51) Int. Cl.
    *H01L 21/28*     (2006.01)
    *H01L 21/8234*     (2006.01)
    *H01L 29/40*     (2006.01)
    *H01L 29/423*     (2006.01)
    *H01L 29/49*     (2006.01)
    *H01L 29/66*     (2006.01)
    *H01L 29/78*     (2006.01)

(52) U.S. Cl.
    CPC ...... *H01L 29/401* (2013.01); *H01L 29/42364* (2013.01); *H01L 29/42376* (2013.01); *H01L 29/4933* (2013.01); *H01L 29/66795* (2013.01); *H01L 29/785* (2013.01)

(56) References Cited

U.S. PATENT DOCUMENTS

| | | | |
|---|---|---|---|
| 10,872,897 B2 | 12/2020 | Yin et al. | |
| 2005/0093084 A1* | 5/2005 | Wang | H01L 29/1054 |
| | | | 257/E21.431 |
| 2008/0036008 A1* | 2/2008 | Hirase | H01L 21/823857 |
| | | | 257/E21.639 |
| 2008/0076214 A1* | 3/2008 | Han | H01L 29/4983 |
| | | | 438/197 |
| 2008/0299723 A1* | 12/2008 | Wu | H01L 27/0629 |
| | | | 257/E21.619 |
| 2013/0075818 A1 | 3/2013 | Lee et al. | |
| 2013/0187236 A1 | 7/2013 | Xie et al. | |
| 2014/0042529 A1 | 2/2014 | Yamamoto et al. | |
| 2015/0171104 A1* | 6/2015 | Prabhakar | H01L 29/4234 |
| | | | 438/200 |
| 2016/0013198 A1 | 1/2016 | Liu | |
| 2016/0343712 A1 | 11/2016 | Xu | |
| 2017/0025442 A1* | 1/2017 | Flachowsky | H01L 21/308 |
| 2017/0110476 A1 | 4/2017 | Ching et al. | |
| 2017/0323970 A1 | 11/2017 | Dolny et al. | |
| 2017/0345928 A1* | 11/2017 | Sun | H01L 29/6656 |
| 2018/0040625 A1* | 2/2018 | Prabhakar | H10B 43/40 |
| 2019/0157421 A1* | 5/2019 | Wang | H01L 21/823456 |
| 2019/0363195 A1* | 11/2019 | Ema | H01L 27/0629 |
| 2019/0371806 A1 | 12/2019 | Ramkumar | |
| 2020/0303508 A1* | 9/2020 | Yun | H01L 29/6656 |
| 2021/0118876 A1 | 4/2021 | Lin et al. | |

FOREIGN PATENT DOCUMENTS

| | | |
|---|---|---|
| TW | 201314747 A | 4/2013 |
| TW | 201349355 A | 12/2013 |
| TW | 201417243 A | 5/2014 |
| TW | 201603244 A | 1/2016 |
| TW | 201705447 A | 2/2017 |
| TW | 201806160 A | 2/2018 |
| TW | 201919119 A | 5/2019 |
| TW | 201924028 A | 6/2019 |

* cited by examiner

300

┌─────────────────────────────────────────────────────┐
│ Form a gate dielectric layer in a first region of a semiconductor
│ substrate and a high-k gate dielectric layer in a second region of the — 305
│ semiconductor substrate
└─────────────────────────────────────────────────────┘
                            ▼
┌─────────────────────────────────────────────────────┐
│ Deposit and pattern a polysilicon gate electrode layer on the gate
│ dielectric layer and the high-k gate dielectric layer to form — 310
│ respective polysilicon gate electrode structures
└─────────────────────────────────────────────────────┘
                            ▼
┌─────────────────────────────────────────────────────┐
│ Form spacer structures on sidewall surfaces of the polysilicon gate — 315
│ electrode structures
└─────────────────────────────────────────────────────┘
                            ▼
┌─────────────────────────────────────────────────────┐
│ Form an etch stop layer on the spacer structures and the polysilicon — 320
│ gate electrode structures
└─────────────────────────────────────────────────────┘
                            ▼
┌─────────────────────────────────────────────────────┐
│ Form a dielectric layer around sidewall surfaces of the polysilicon — 325
│ gate electrode structures
└─────────────────────────────────────────────────────┘
                            ▼
┌─────────────────────────────────────────────────────┐
│ Replace the polysilicon gate electrode structure in the second region — 330
│ of the semiconductor substrate with a metal gate electrode structure
└─────────────────────────────────────────────────────┘
                            ▼
┌─────────────────────────────────────────────────────┐
│ Form a silicide on a top surface of the polysilicon gate electrode — 335
│ structure in the first region
└─────────────────────────────────────────────────────┘

Fig. 3

HIGH VOLTAGE TRANSISTOR STRUCTURE

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 3 is flow chart that describes a method for forming an input/output (I/O) field effect transistor (FET) structure with a polysilicon gate electrode and a silicon oxide gate dielectric in an I/O region of the substrate and a non-I/O FET structure with a metal gate electrode and a high-k gate dielectric in a non-I/O region of the substrate, in accordance with some embodiments.

DETAILED DESCRIPTION

Figure 1:
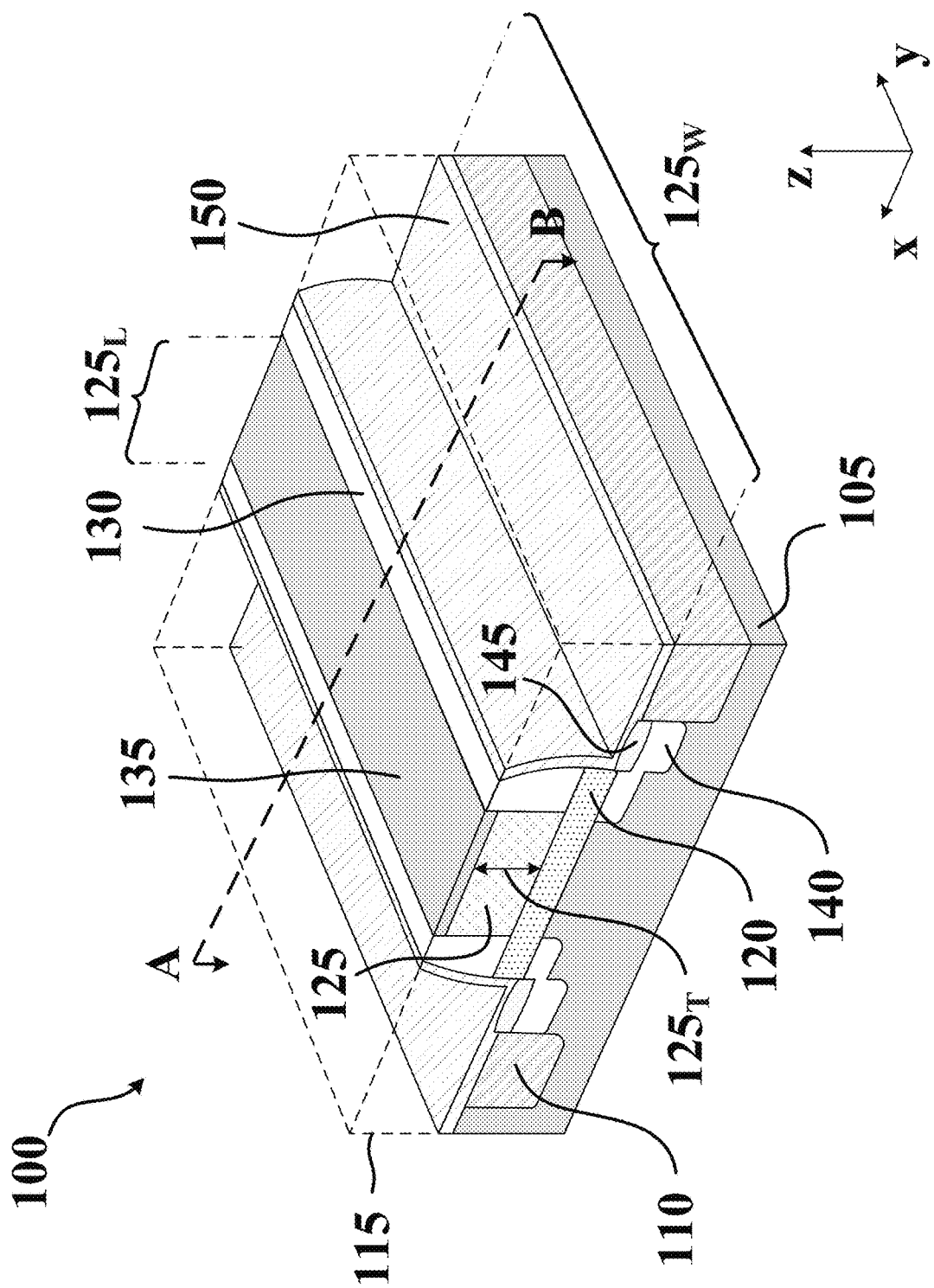
FIG. 1 is an isometric view of an input/output (I/O) planar field effect transistor (FET) structure with a polysilicon gate electrode and a silicon oxide gate dielectric, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

The term "vertical," as used herein, means nominally perpendicular to the surface of a substrate.

Integrated circuits (IC) can include combinations of semiconductor structures like input/output (I/O) field effect transistors (FETs) and non-I/O FETs. The I/O FETs can be part, for example, of a circuit formed in a peripheral region of the IC referred to as "I/O region" or "high voltage region," while the non-I/O devices can be part of a "core" circuit referred to as logic circuit or memory circuit formed in a "core" region of the IC. The I/O devices can be configured to receive input/output voltages or current of the IC and tolerate a higher voltage or current than the non-I/O devices. For example, the I/O devices can be configured to handle input voltages from an external power supply, such as a lithium ion battery, outputting about 5 V. Further, the I/O devices can be part of a transformer circuit that outputs a distribution voltage of about 1 V which can be subsequently distributed to the non-I/O FETs. On the other hand, the non-I/O devices are not configured to handle the input/output voltages/current directly and are referred to as core devices, logic devices, and/or memory devices. For example, the non-I/O devices can include FETs forming logic gates, such as NAND, NOR, inverters, or a combination thereof. Additionally, the non-I/O devices can include memory devices, such as static random-access memory (SRAM) devices, dynamic random-access memory (DRAM) devices, other types of memory devices, or combinations thereof.

For fabrication efficiency, it is desirable that I/O and non-I/O FETs are formed concurrently on the same substrate. Metal gate materials and high-dielectric constant (high-k) dielectric materials (e.g., with a k-value greater than about 3.9) have been implemented in the gate stack fabrication of the non-I/O FETs for several technology nodes to improve the device characteristics and promote device scaling. To simplify, harmonize, and streamline the fabrication process between I/O and non-I/O FETs, metal gate and high-k dielectric materials have also been implemented for the gate stacks of I/O FETs.

Because the I/O and non-I/O FETs are configured to operate at different voltages (e.g., at about 5 V and about 1 V respectively), their structures can vary with regard to their physical dimensions. For example, the gate stack of the I/O FETs can have a larger surface area (e.g., greater than about 1 μm$^2$) and include a thicker gate oxide compared to the gate stack of the non-I/O FETs which are smaller in size. Due to the larger size of I/O FETs, chemical mechanical planarization (CMP) for these devices can be challenging if the gate electrode material is a metal or a metallic stack. For example, planarization of such large features can cause erosion or "dishing" of the gate electrode for the I/O FET. Consequently, the thickness of the gate electrode of the I/O FET may be non-uniform across the device, which can degrade the performance and reliability of the I/O FET.

Embodiments of the present disclosure are directed to a method for forming I/O FETs with polysilicon gate electrodes and silicon oxide gate dielectrics concurrently with non-I/O FETs having metal gate electrodes and high-k gate dielectrics. In some embodiments, the polysilicon gate electrode provides resilience to CMP dishing and therefore allows for a process to form larger I/O FETs (e.g., equal to or greater than about 10 $\mu m^2$). In some embodiments, the method described herein can be applied to planar and non-planar transistors (e.g., finFETs).

According to some embodiments, FIG. 1 is an isometric view of a polysilicon I/O FET structure 100. Polysilicon I/O FET structure 100 is formed on a semiconductor substrate 105 between substrate isolation regions 110. In some embodiments, each substrate isolation region 110 can be a shallow trench isolation region (e.g., an STI region) that includes a dielectric material such as silicon dioxide ($SiO_2$) or a low-k dielectric material (e.g., with a k-value lower than about 3.9). Substrate isolation regions 110 are formed in semiconductor substrate 105 to provide electrical isolation between doped regions of semiconductor substrate 105. The doped regions of semiconductor substrate 105 are not shown in FIG. 1 for simplicity. According to some embodiments, semiconductor substrate 105 can include (i) silicon, (ii) a compound semiconductor such as gallium arsenide (GaAs), gallium phosphide (GaP), indium phosphide(InP), indium arsenide (InAs), and/or indium antimonide (InSb), (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof. For example purposes, semiconductor substrate 105 will be described in the context of crystalline silicon. Based on the disclosure herein, other materials, as discussed above, can be used. These materials are within the spirit and scope of this disclosure.

Polysilicon I/O FET structure 100 is laterally isolated from neighboring devices or structures (not shown in FIG. 1) through dielectric layer 115. In some embodiments, dielectric layer 115 can be an interlayer dielectric such as $SiO_2$, doped $SiO_2$, or any other suitable dielectric material with a dielectric constant equal to or less than about 3.9 (e.g., about 3.6, about 3.3, etc.). By way of example and not limitation, dielectric layer 115 surrounds the side surfaces of polysilicon I/O FET structure 100 as shown in FIG. 1.

In some embodiments, polysilicon I/O FET structure 100 includes a gate stack having a gate dielectric layer 120 formed on semiconductor substrate 105 and a polysilicon gate electrode layer 125 disposed on gate dielectric layer 120. By way of example and not limitation, gate dielectric layer 120 can include silicon oxide ($SiO_2$), which can be thermally grown on (e.g., in contact with) semiconductor substrate 105. By way of example and not limitation, gate dielectric layer 120 can have a thickness between about 20 Å and about 500 Å and can be substantially thicker than a gate dielectric layer of a non-I/O FET (e.g., from about 2 to about 20 times thicker). Gate dielectric layer 120 allows polysilicon I/O FET structure 100 to operate with high gate voltages (e.g., about 5 V). In some embodiments, polysilicon gate electrode layer 125 has a thickness $125_T$ that ranges from about 10 nm to about 300 nm, a width $125_W$ that ranges from about 0.1 μm to about 100 μm, and a length $125_L$ that ranges from about 0.05 μm to about 50 μm. According to some embodiments, the surface area (e.g., $125_W \times 125_L$) of polysilicon gate electrode layer 125 is greater than about 1 $\mu m^2$. In some embodiments, the surface area of polysilicon gate electrode layer 125 is between about 1 $\mu m^2$ and about 10 $\mu m^2$. In some embodiments, the surface area of polysilicon gate electrode layer 125 is greater than about 10 $\mu m^2$, for example about 20 $\mu m^2$.

Figure 11:
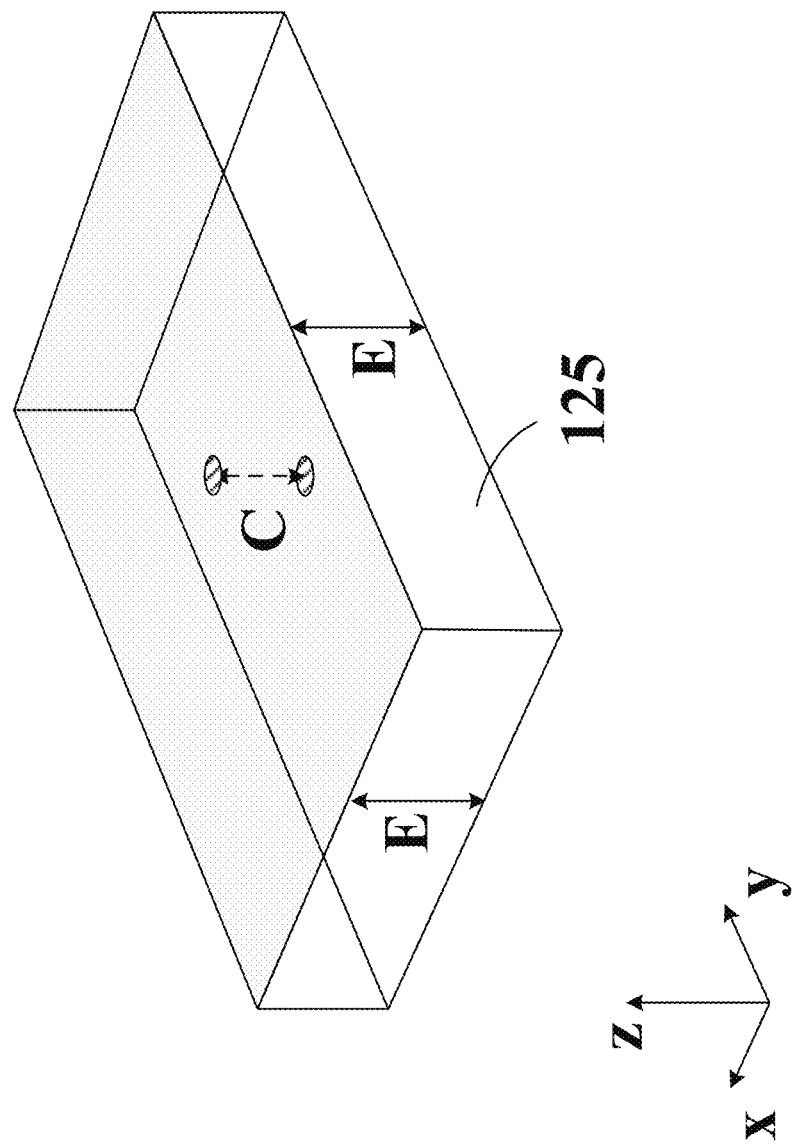
FIG. 11 is an isometric view of a polysilicon gate electrode for an input/output (I/O) field effect transistor (FET) structure after a chemical mechanical polishing (CMP) process, in accordance with some embodiments.

In some embodiments, polysilicon gate electrode layer 125 of polysilicon I/O FET structure 100 offers resilience to dishing caused by a gate electrode CMP process even when the surface area of the gate electrode is greater than about 10 μm In other words, thickness $125_T$ of polysilicon I/O FET structure 100 can be substantially uniform across length $125_L$ and width $125_W$ after a gate CMP process. According to some embodiments, thickness $125_T$ variation across length $125_L$ and width $125_W$ after a gate CMP process can be about 10% or less. For a thickness $125_T$ of about 10 nm, the thickness variation can be about 1 nm. In referring to FIG. 11, the center to edge thickness ratio (C/E) for a polished polysilicon gate electrode layer 125 of polysilicon I/O FET structure 100 (e.g., post CMP) is between about 0.9 and about 1, according to some embodiments. That is, the center thickness (C) of a polished polysilicon gate electrode layer 125 of polysilicon I/O FET structure 100 is between about 90% and about 100% of the edge (E) thickness along the x-y plane.

Further, polysilicon I/O FET structure 100 shown in FIG. 1 includes spacer structures 130 on sidewalls along width $125_W$ of polysilicon gate electrode layer 125. By way of example and not limitation, spacer structures 130 can include a nitride, such as silicon nitride, and can further include one or more layers to form a spacer stack.

In some embodiments, polysilicon gate electrode layer 125 includes a silicided portion where contact structures (not shown in FIG. 1) can be formed thereon. In some embodiments, the silicided portion of polysilicon gate electrode layer 125 is a cladding silicide layer 135 that includes titanium silicide, nickel silicide, cobalt silicide, or any suitable silicide material that can be formed or grown on polysilicon gate electrode layer 125. In some embodiments, polysilicon gate electrode layer 125 is doped so that it becomes conductive. By way of example and not limitation, the dopant concentration of polysilicon gate electrode layer 125 can be between about $10^{13}$ atoms/$cm^3$ and about $10^{19}$ atoms/$cm^3$ and the dopant species can be either n-type (e.g., phosphorous, arsenic, antimony) or p-type (e.g., boron, indium, and gallium).

Additionally, polysilicon I/O FET structure 100 can include source/drain regions 140 and silicide layer 145. In some embodiments, an etch stop layer 150 is disposed over substrate isolation regions 110, semiconductor substrate 105, silicide layer 145, sidewall surfaces of gate dielectric layer 120, and spacer structures 130 as shown in FIG. 1.

Figure 2:
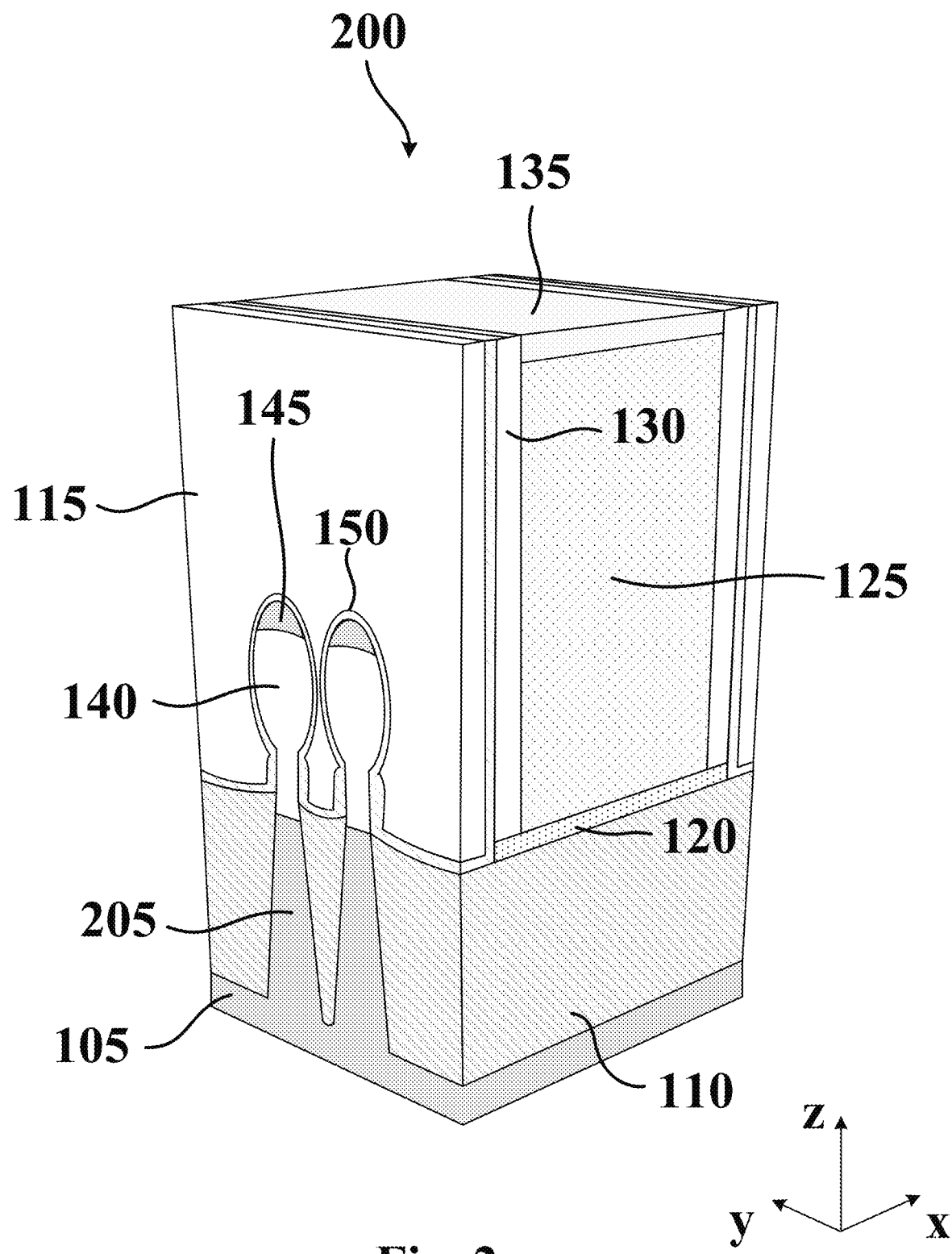
FIG. 2 is an isometric view of two input/output (I/O) fin field effect transistor (FET) structures with a polysilicon gate electrode and a silicon oxide gate dielectric, in accordance with some embodiments.

By way of example and not limitation, polysilicon I/O FET structure 100 shown in FIG. 1 is a planar FET structure. However, this is not limiting, and polysilicon I/O FET structures, according to the embodiments described herein, can be formed on one or more semiconductor fins to form one or more non-planar polysilicon I/O FET structures, such as polysilicon I/O finFET structures. For example, FIG. 2 is an isometric view of two polysilicon I/O finFET structures 200 each formed on a semiconductor fin 205. Polysilicon I/O FET structure 100 and polysilicon I/O finFET structures 200 shown respectively in FIGS. 1 and 2 share similar structural elements, such as gate dielectric layer 120, polysilicon gate electrode layer 125, spacer structures 130, silicide layer 135, and etch stop layer 150. Further, the surface area of polysilicon gate electrode layers 125 in polysilicon I/O FET structure 100 and polysilicon I/O finFET structures 200 can be substantially equal—e.g., greater than about 1 μm², between about 1 μm² and about 10 μm², or greater than about 10 μm² (e.g., about 20 μm²). In some embodiments, the thickness of gate dielectric layer 120 is substantially thicker than respective gate dielectric layers in non-I/O FETs and non-I/O finFETs.

In some embodiments, polysilicon I/O FET structure 100 shown in FIG. 1 can be formed concurrently with non-I/O FET structures on the same semiconductor substrate. Likewise, polysilicon I/O finFET structures 200 shown in FIG. 2 can be formed concurrently with non-I/O finFET structures on the same semiconductor substrate.

FIG. 3 is a flow chart of a method 300 that describes the process for forming planar and non-planar polysilicon I/O FET structures with polysilicon gate electrodes and silicon oxide gate dielectrics concurrently with non-I/O FET structures having metal gate electrodes and high-k gate dielectrics. Other fabrication operations may be performed between the various operations of method 300 and may be omitted merely for clarity. For example purposes, the polysilicon I/O FET structure formed using method 300 will be described in the context of a planar structure, such as polysilicon I/O FET structure 100. Based on the disclosure herein, non-planar I/O polysilicon FET structures, like I/O polysilicon finFET structures 200, which share similar structural elements and surface area, as discussed above, can be formed using method 300. These non-planar I/O polysilicon FET structures (e.g., I/O polysilicon finFET structures) are within the spirit and scope of this disclosure. Method 300 will be described in reference to FIGS. 4-9.

Figure 4:
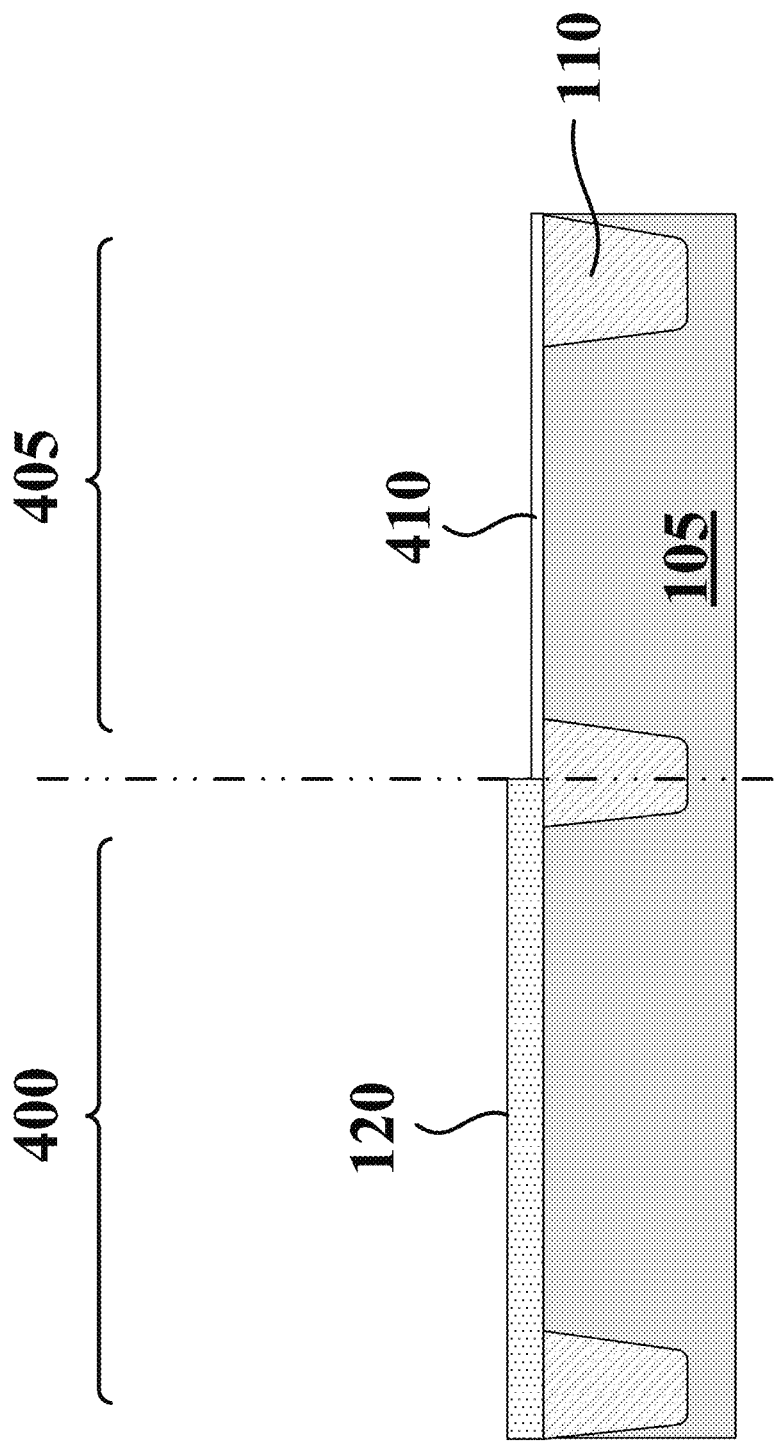
FIGS. 4-10 are cross-sectional views describing a fabrication process for an input/output (I/O) field effect transistor (FET) structure with a polysilicon gate electrode and a silicon oxide gate dielectric in an I/O region of the substrate and a non-I/O FET structure with a metal gate electrode and a high-k gate dielectric in a non-I/O region of the substrate, in accordance with some embodiments.

In referring to FIGS. 3 and 4, method 300 begins with operation 305 and the process for forming a gate dielectric layer in a first region of a semiconductor substrate and a high-k gate dielectric layer in a second region of the semiconductor substrate. In some embodiments, the first region of the semiconductor substrate corresponds to an area of an IC where I/O devices are formed—e.g., an I/O region of the semiconductor substrate. The second region of the semiconductor substrate corresponds to an area of the IC where non-I/O devices are formed—e.g., a non-I/O region of the semiconductor substrate.

By way of example and not limitation, referring to FIG. 4, gate dielectric layer 120 corresponds to the gate dielectric layer of operation 305 formed in an I/O substrate region 400, and high-k gate dielectric layer 410 corresponds to the high-k gate dielectric layer of operation 305 formed in a non-I/O substrate region 405 of semiconductor substrate 105. Since gate dielectric layer 120 is used for I/O FETs (and not for non-I/O FETs), gate dielectric layer 120 is selectively formed in an I/O substrate region 400 of semiconductor substrate 105, as shown in FIG. 4. In some embodiments, I/O substrate region 400 of FIG. 4 is a cross-sectional view of semiconductor substrate 105 across cut-line AB shown in FIG. 1. According to some embodiments, substrate region 400 corresponds to an I/O area of the IC and substrate region 405 corresponds to a non-I/O region (e.g., core or logic region) of the IC. In some embodiments, I/O substrate region 400 and non-I/O substrate region 405 are not neighboring regions—for example, I/O substrate region 400 and non-I/O substrate region 405 are spaced apart. A selective process for forming dielectric layer 120 in I/O substrate region 400 can include first forming gate dielectric layer 120 on both I/O and non-I/O substrate regions and then patterning gate dielectric layer 120 to remove gate dielectric layer 120 from non-I/O substrate region 405. By way of example and not limitation, gate dielectric layer 120 can be thermally grown or deposited at a thickness range between about 20 Å and about 500 Å.

Byway of example and not limitation, high-k gate dielectric layer 410 has a dielectric constant (k-value) greater than about 3.9 (e.g., about 4.0, about 10, about 20, about 30, etc.). In some embodiments, high-k gate dielectric layer 410 is a metal oxide layer that is blanket deposited on both I/O and non-I/O substrate regions and then patterned so that it is removed from I/O substrate region 400 as shown in FIG. 4. In some embodiments, the thickness of high-k gate dielectric layer 410 ranges from about 5 Å to about 20 Å. In some embodiments, an interfacial gate dielectric layer, not shown in FIG. 4, is formed between high-k dielectric layer 410 and semiconductor substrate 105 in non-I/O substrate region 405. This interfacial gate dielectric layer can include, for example, silicon oxide or silicon oxynitride. In some embodiments, high-k gate dielectric layer 410 and the interfacial gate dielectric layer form a gate dielectric stack in non-I/O substrate region 405.

In referring to FIG. 3, method 300 continues with operation 310 and the process for depositing and patterning a polysilicon gate electrode layer on gate dielectric layer 120 and high-k gate dielectric layer 410 to form respective polysilicon gate electrode structures for I/O and non I/O FETs. In referring to FIG. 5, polysilicon gate electrode layer 125 can be blanket deposited at a thickness between about 100 Å and about 3000 Å on semiconductor substrate 105 and subsequently patterned to concurrently form I/O FET gate electrode structure 500 in I/O substrate region 400 and non-I/O FET gate electrode structure 505 in non-I/O substrate region 405. In some embodiments, I/O FET gate electrode structure 500 and non-I/O FET gate electrode structure 505 are formed using a single patterning operation. In some embodiments, during operation 310, patterning of polysilicon gate electrode layer 125 can be accomplished with the help of a hard mask stack that includes a bottom oxide layer 515 (e.g., a silicon oxide layer) and a top nitride layer 520 (e.g., a silicon nitride layer). Oxide layer 515 and nitride layer 520 can protect polysilicon gate electrode layer 125 during the etching operation of the aforementioned patterning process.

In some embodiments, I/O FET gate electrode structure 500 formed in I/O substrate region 400 is configured to have a length greater than non-I/O FET gate electrode structure 505 formed in non-I/O substrate region 405. For example, I/O FET gate electrode structure 500 has a length $500_L$ (e.g., a gate length) that ranges from about 0.05 μm to about 50 μm, while non-I/O FET gate electrode structure 505 has a length (e.g., a gate length) between about 5 nm and about 50 nm. In some embodiments, I/O FET gate electrode structures 500 having a length $500_L$ smaller than about 50 nm can adversely impact the performance of the I/O FET. For example, I/O FETs with I/O FET gate electrode structures 500 having a length smaller than about 0.05 μm may exhibit high levels of current densities but unacceptable amounts of leakage current. On the other hand, I/O FET gate electrode structures 500 having a length $500_L$ larger than about 50 μm have a footprint (e.g., surface area) that may reduce the available space for other IC components. In other words, there is a tradeoff between the size of I/O FET gate electrode structures 500 and the available space for other IC components.

In some embodiments, after patterning, I/O FET gate electrode structure 500 and non-I/O FET gate electrode structure 505 may have substantially equal widths along the y-axis (not shown in FIG. 5) and respective heights $500_H$ and $505_H$ along the z-axis. However, in subsequent global planarization operations $500_H$ will become shorter than $505_H$ due to the thickness difference between gate dielectric layer 120 and high-k dielectric layer 410.

Figure 5:
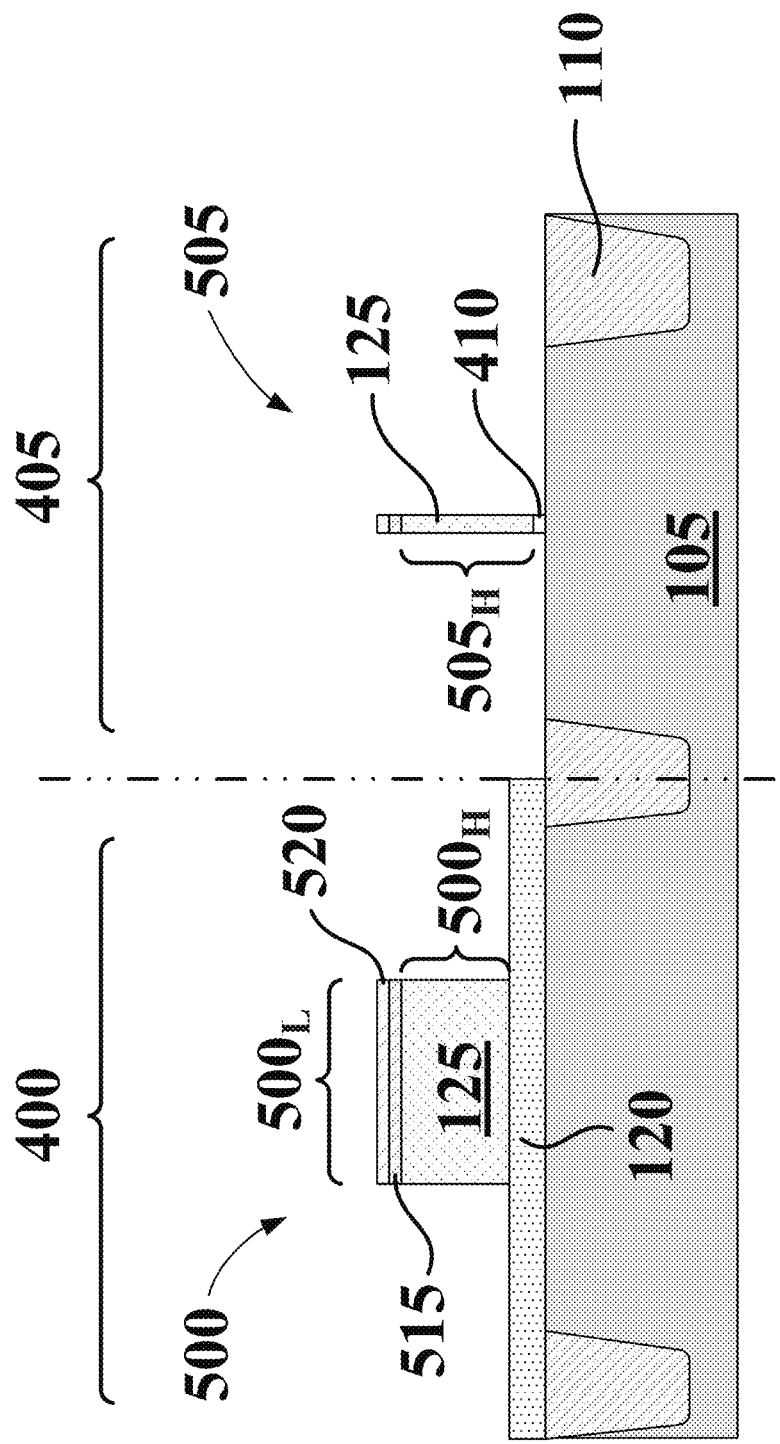

In some embodiments, during the aforementioned patterning process of polysilicon gate electrode layer 125, gate dielectric layer 120 in I/O substrate region 400 remains on semiconductor substrate 105 and is not removed. On the other hand, high-k gate dielectric layer 410 is patterned together with polysilicon gate electrode layer 125. Consequently, length $500_L$ of I/O FET gate electrode structure 500 is shorter than the length of gate dielectric layer 120 while the length of non-I/O FET gate electrode structure 505 is substantially equal to the length of high-k gate dielectric layer 410 as shown in FIG. 5

According to some embodiments, the surface area or footprint of I/O FET gate electrode structure 500 is greater than about 1 µm², between about 1 µm² and about 10 µm², or greater than about 10 µm² (e.g., about 20 µm²). According to some embodiments, dishing during CMP and space availability are factors (among others) for defining the lateral dimensions (e.g., length and width) for I/O FET gate electrode structure 500 shown in FIG. 5.

In some embodiments, non-I/O FET gate electrode structure 505 is a sacrificial gate electrode structure that will be replaced with a metal gate electrode stack in a subsequent operation.

Figure 6:
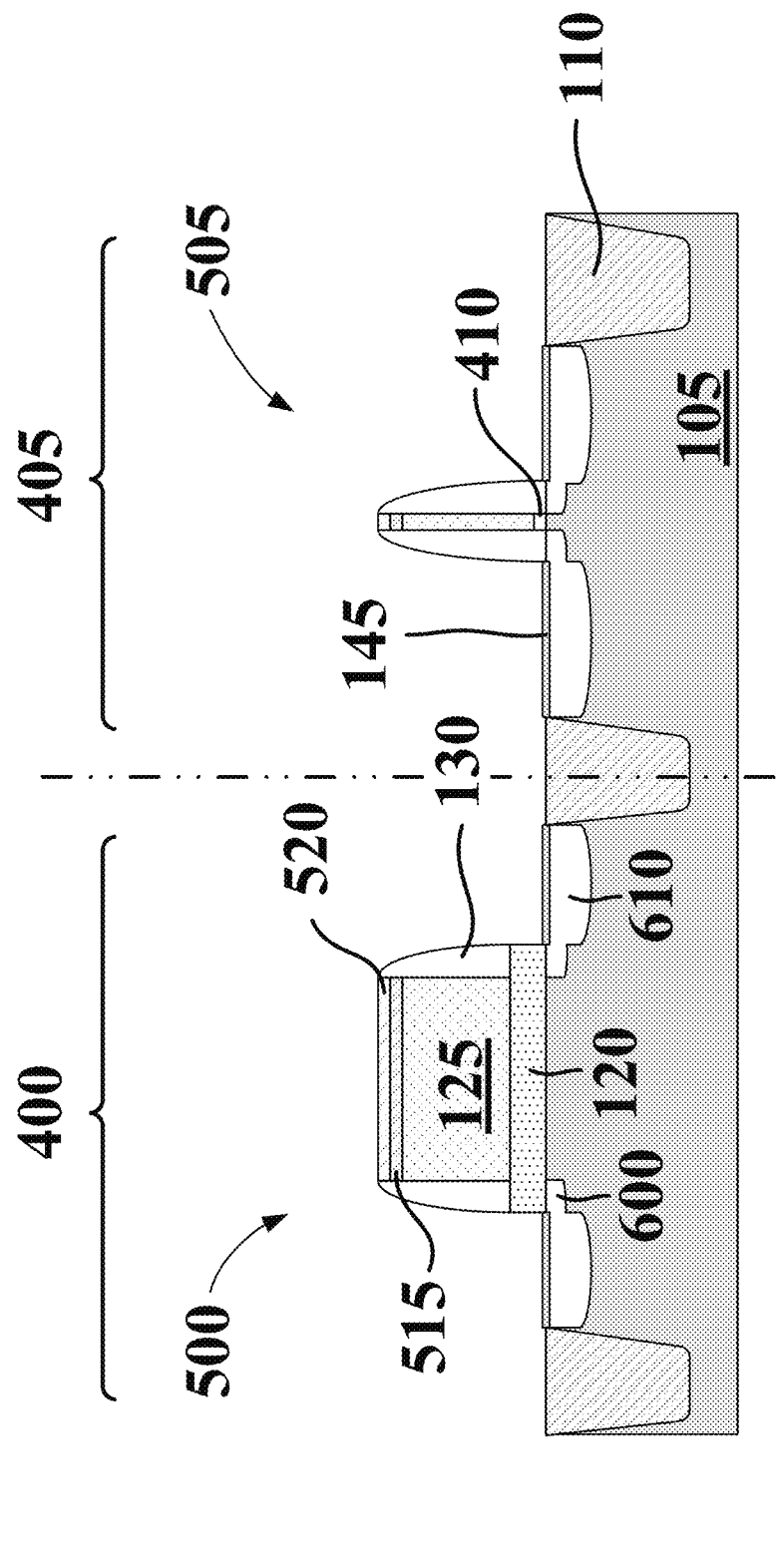

In referring to FIG. 3, method 300 continues with operation 315 and the process for forming spacer structures on sidewall surfaces of the polysilicon gate electrode structures, such as I/O FET gate electrode structure 500 and non-I/O FET gate electrode structure 505. By way of example and not limitation, FIG. 6 shows formed spacer structures 130 on the sidewalls of I/O FET gate electrode structure 500 and non-I/O FET gate electrode structure 505. By way of example and not limitation, spacer structures 260 can be formed by a blanket deposition of a spacer material (e.g., silicon nitride) followed by an anisotropic etching process that selectively removes the spacer material from all horizontal surfaces (e.g., the y-x plane) of the structures shown in FIG. 6.

In some embodiments, once spacer structures 130 have been formed on sidewall surfaces of I/O FET gate electrode structure 500, a second etching process removes portions of gate dielectric layer 120 not masked (e.g., covered) by spacer structures 130 in I/O substrate region 400. In other words, spacer structures 130 and I/O FET gate electrode structure 500 are used as an etching mask to define the length of gate dielectric layer 120 for the I/O FETs in I/O substrate region 400. Therefore, spacer structures 130 do not cover sidewall surfaces of gate dielectric layer 120 in I/O FETs as shown in FIG. 6. In contrast, for non-I/O FETs, spacer structures 130 extend over the sidewall surfaces of high-k dielectric layer 410.

In some embodiments, prior to forming spacer structures 130 in operation 315, lightly doped regions 600 are formed by an ion implant process in semiconductor substrate 105 using I/O FET gate electrode structure 500 and non-I/O FET gate electrode structure 505 as implant masks. Later, after forming spacer structures 130, a second ion implant process forms heavily doped regions 610 in I/O substrate region 400 and non-I/O substrate region 405 respectively. During the second ion implant process, spacer structures 130 are used as implant masks. As a result, lightly doped regions 600 are substantially aligned to I/O FET gate electrode structure 500 and non-I/O FET gate electrode structure 505 and heavily doped regions 610 are substantially aligned to spacer structures 130. In some embodiments, lightly doped regions 600 and heavily doped regions 610 combined form source/drain regions of the I/O and non-I/O FETs.

In some embodiments, after forming spacer structures 130, a top surface of heavily doped regions 610 is silicided to form a self-aligned silicide ("salicide") layer 145 over the source/drain regions of I/O and non-I/O FETs. By way of example and not limitation, silicide layer 145 can be formed as follows. A metal layer can be blanket deposited over semiconductor substrate 105. During a subsequent annealing process, a silicide is formed in sites where the deposited metal is in direct contact with the exposed silicon, such as heavily doped regions 610 of semiconductor substrate 105. During the silicidation process, top surfaces of I/O FET gate electrode structure 500 and non-I/O FET gate electrode structure 505 are not silicided because both structures are capped (e.g., not exposed) with oxide layer 515 and nitride layer 520. After the silicidation process, the unreacted metal is removed with, for example, a wet etching process. In some embodiments, a second annealing process is performed after the removal of the unreacted metal to complete the silicidation process. By way of example and not limitation, silicide layer 145 can include nickel silicide, titanium silicide, cobalt silicide, tungsten silicide, or any other suitable metal silicide.

Figure 7:
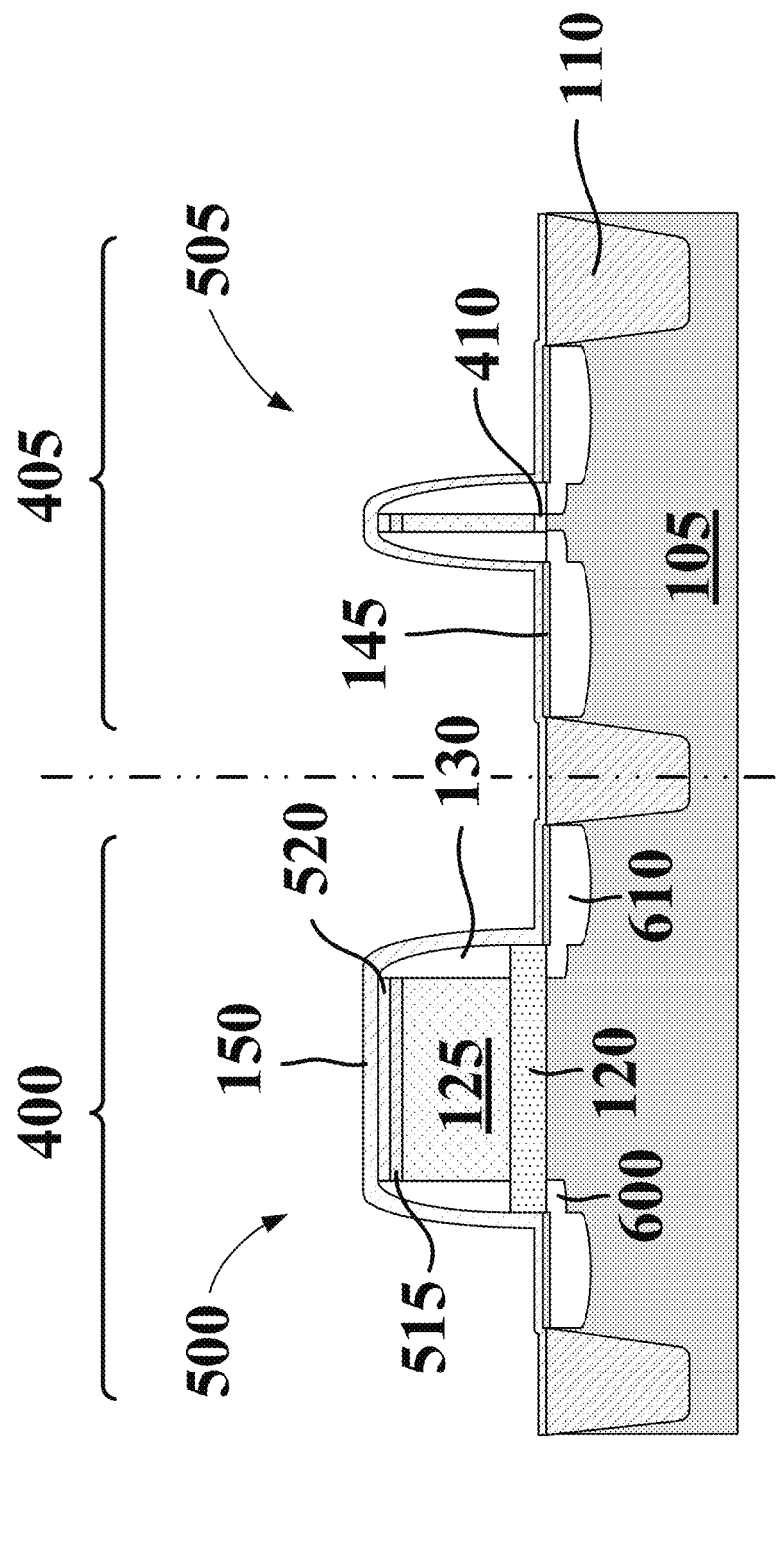

In referring to FIG. 3, method 300 continues with operation 320 and the process for forming an etch stop layer on spacer structures 130, I/O FET gate electrode structure 500, and non-I/O FET gate electrode structure 505. In some embodiments, the etch stop layer can be blanket deposited to cover (e.g., conformally) all the features disposed on or in semiconductor substrate 105. For example, as shown in FIG. 7, etch stop layer 150 is deposited I/O FET gate electrode structure 500, non-I/O FET gate electrode structure 505, spacer structures 130, isolation regions 110 and silicide layer 145. By way of example and not limitation, etch stop layer 150 can be a nitride layer, such as a silicon nitride layer.

Figure 8:
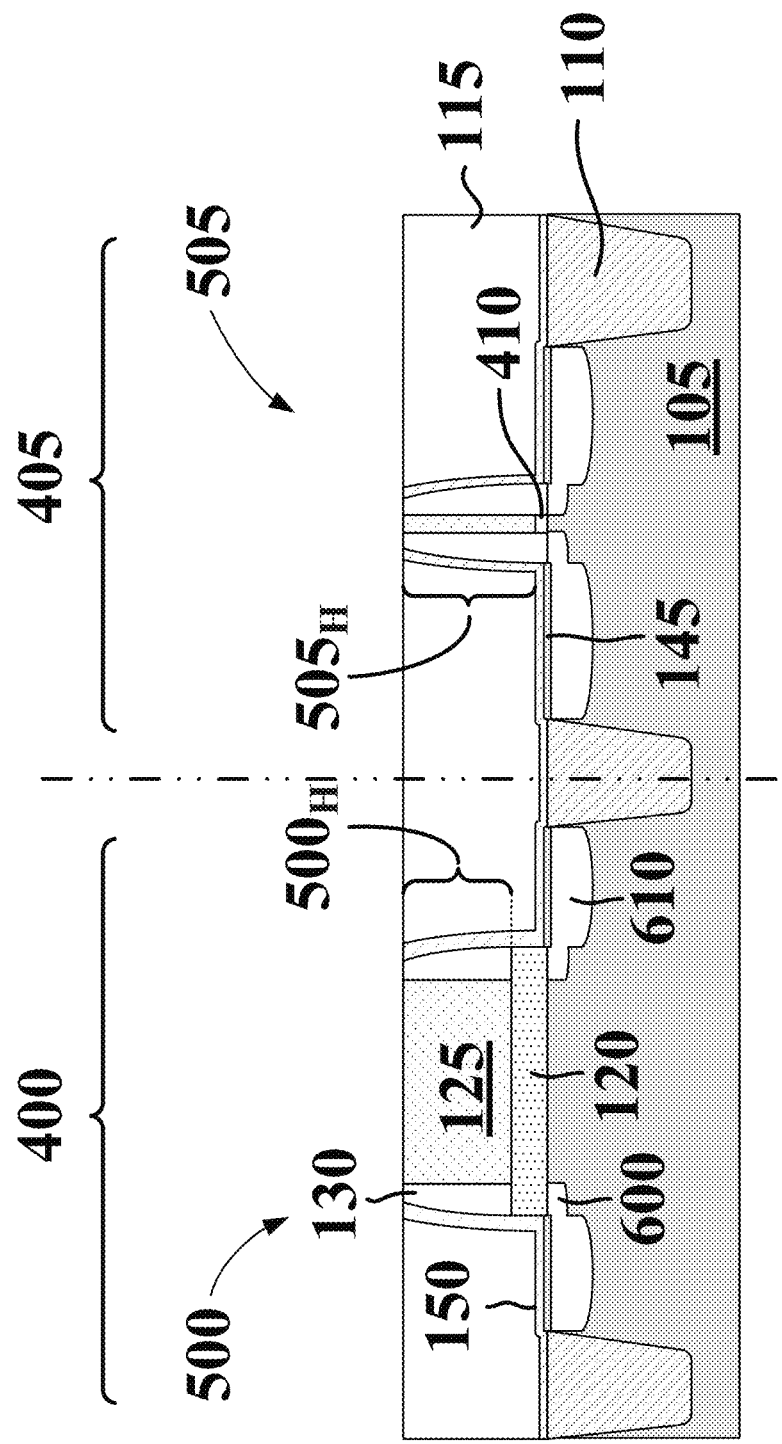

In referring to FIGS. 3 and 8, method 300 continues with operation 325 and the process for forming a dielectric layer 115 around sidewall surfaces of I/O FET gate electrode structure 500 and non-I/O FET gate electrode structure 505. By way of example and not limitation, a dielectric layer 115 can be blanket deposited over semiconductor substrate 105 so that I/O FET gate electrode structure 500 and non-I/O FET gate electrode structure 505 become embedded in dielectric layer 115. A subsequent CMP process removes excess dielectric material from top surfaces of I/O FET gate electrode structure 500 and non-I/O FET gate electrode structure 505. In some embodiments, the CMP process removes a portion of etch stop layer 150, nitride layer 520, and oxide layer 515 so that a top surface of polysilicon gate electrode layer 125 is exposed in both I/O FET gate electrode structure 500 and non-I/O FET gate electrode structure 505 as shown in FIG. 8. In some embodiments, as a result of the aforementioned CMP process, the top surface of polysilicon gate electrode layer 125 in both I/O FET gate electrode structure 500 and non-I/O FET gate electrode structure 505 become substantially coplanar with the top surface of dielectric layer 115. In some embodiments, after the CMP process, the top surface of I/O FET gate electrode structure 500 remains substantially flat with no dishing. Additionally, after the CMP process, I/O FET gate electrode structure 500 becomes shorter than non-I/O FET gate electrode structure 505 (e.g., 500$_H$<505$_H$) due to the thickness difference between gate dielectric layer 120 and high-k dielectric layer 410.

Figure 9:
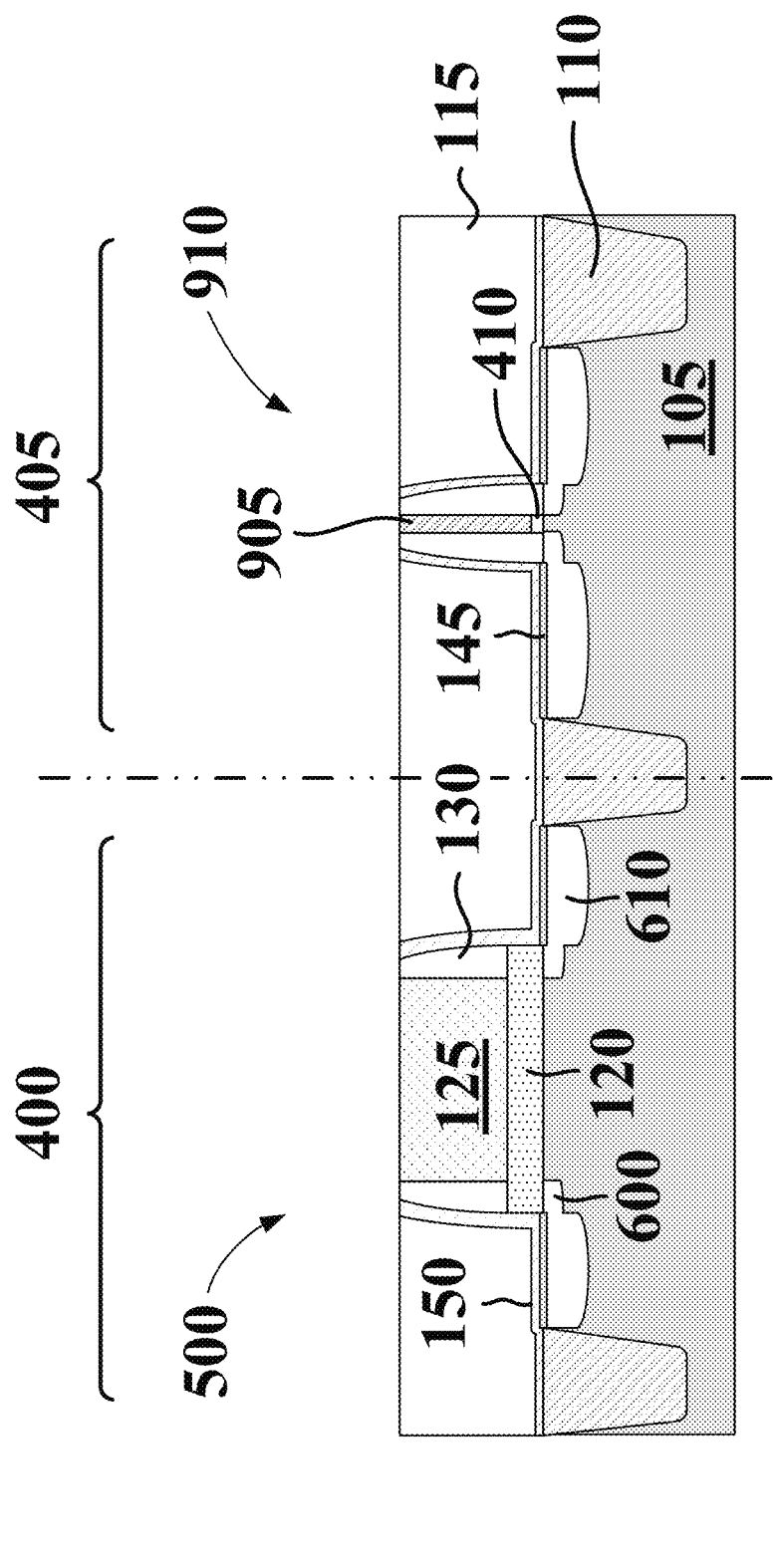

Referring to FIG. 3, method 300 continues with operation 330 and the process for replacing gate electrode layer 125 from non-I/O FET gate electrode structure 505 with a metal gate electrode structure. By way of example and not limitation, referring to FIG. 9, metal gate electrode layer 125 is selectively removed and replaced with metal gate electrode 905 to form non-I/O FET 910. In some embodiments, metal gate electrode 905 includes one or more metal or metallic layers. By way of example and not limitation, selective removal of polysilicon gate electrode layer 125 from non-I/O FET gate electrode structure 505 can be achieved by masking I/O substrate region 400 with a hard mask (e.g., a nitride layer) while removing polysilicon gate electrode layer 125 from non-I/O FET gate electrode structure 505 with a wet etching process, a dry etching process, or combinations thereof. In some embodiments, high-k dielectric layer 410 is not removed by the etching process used to remove polysilicon gate electrode layer 125 from non-I/O FET gate electrode structure 505. Once polysilicon gate electrode layer 125 has been selectively removed from non-I/O FET gate electrode structure 505, metal gate electrode 905 can be subsequently deposited. In some embodiments, material from metal gate electrode 905 is blanket deposited in I/O and non-I/O substrate regions 400 and 405, respectively. A CMP process subsequently removes excess metal gate electrode material from the top surfaces of dielectric layer 115 to form non-I/O FET 910. During the CMP process of the metal gate electrode material, the hard mask (not shown in FIG. 9) on I/O substrate region 400 is removed and polysilicon gate electrode layer 125 from I/O FET gate electrode structure 500 is exposed as shown in FIG. 9. According to some embodiments, after the metal gate electrode CMP process, the top surface of I/O FET gate electrode structure 500 remains substantially flat with no dishing. In some embodiments, polysilicon gate electrode layer 125 from I/O FET gate electrode structure 500 is resilient to dishing during the aforementioned metal gate electrode material CMP process.

Figure 10:
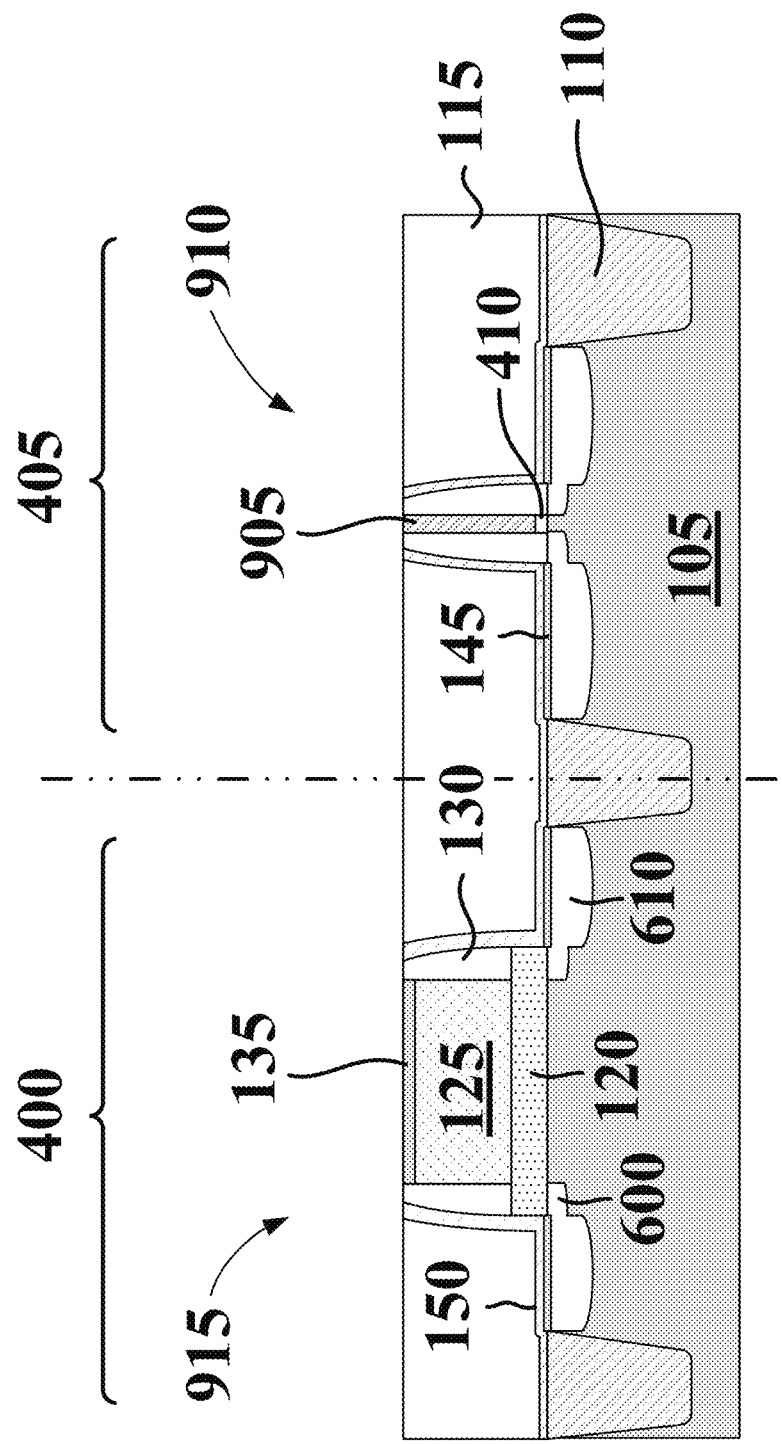

In referring to FIG. 3, method 300 concludes with operation 335 and the process for forming a silicide on the top surface of I/O FET gate electrode structure 500 to form polysilicon I/O FET 915 shown in FIG. 9. In some embodiments, the silicidation process can be similar to the silicidation process described for the process for forming silicide layer 145 above. In some embodiments, non-I/O substrate region 405 can be masked during the silicidation process with a hard mask (e.g., a nitride layer). Referring to FIG. 10, a metal layer (not shown in FIG. 10) can be blanket deposited on dielectric layer 115 over I/O and non-I/O substrate regions 400 and 405 respectively. During a subsequent annealing process, a silicide is formed on the exposed top surface of I/O FET gate electrode structure 500. After the silicidation process, the unreacted metal is removed with, for example, a wet etching process. In some embodiments, a second annealing process is performed after the removal of the unreacted metal to complete the silicidation process. As a result, silicide layer 135 is formed in the top surface of polysilicon gate electrode layer 125 and polysilicon I/O FET 915 is formed. By way of example and not limitation, silicide layer 135 can include nickel silicide, titanium silicide, cobalt silicide, tungsten silicide, or any other suitable metal silicide. According to some embodiments, the process for forming silicide layer 135 on polysilicon gate electrode layer 125 can be combined with a process for forming a silicide layer in other areas of the IC.

In some embodiments, method 300 can be used to form non-planar I/O FET structures with polysilicon gate electrodes and silicon oxide gate dielectrics, like I/O finFET structure 200 shown in FIG. 2.

Embodiments of the present disclosure are directed to a method for forming I/O FETs featuring polysilicon gate electrodes/silicon oxide gate dielectrics integrated with non-/O FETs featuring metal gate electrodes/high-k gate dielectrics. In some embodiments, the polysilicon gate electrode of the I/O FETs provides resilience to CMP dishing during the metal gate electrode CMP process of the non-I/O FETs, and therefore allows a process to form I/O FETs with a larger footprint—e.g., greater than about 1 μm², between about 1 μm² and about 10 μm², or greater than about 10 μm² (e.g., about 20 μm²). In some embodiments, the method described herein is compatible with planar and non-planar transistor structures (e.g., finFETs).

In some embodiments, a structure includes a first transistor formed on a first region of a semiconductor substrate, where the first transistor includes a gate dielectric; a polysilicon gate electrode disposed on the gate dielectric with the gate dielectric being wider than the gate electrode; and a first spacer structure abutting a sidewall of the polysilicon gate electrode so that a sidewall of the spacer structure is aligned to a sidewall of the gate dielectric. The structure further includes a second transistor formed on a second region of the semiconductor substrate, where the second transistor is narrower than the first transistor and includes a high-k gate dielectric; a metal gate electrode disposed on and aligned with the high-k gate dielectric so that a sidewall of the metal gate electrode is aligned to a sidewall of the high-k gate dielectric; and a second spacer structure abutting the sidewalls of the metal gate electrode and high-k gate dielectric.

In some embodiments, a method includes depositing a silicon oxide layer on a first region of a semiconductor substrate; depositing a high-k dielectric layer, thinner than the silicon oxide layer, on a second region of the semiconductor substrate; depositing a polysilicon layer on the silicon oxide layer and high-k dielectric layer; patterning the polysilicon layer to form a first polysilicon gate electrode structure on the silicon oxide layer and a second polysilicon gate electrode structure on the high-k dielectric layer, where the first polysilicon gate electrode structure is wider than the second polysilicon gate electrode structure and narrower than the silicon oxide layer. The method further includes forming a first spacer on sidewalls of the first polysilicon gate electrode structure so that outer sidewalls of the first spacer are aligned to sidewalls of the silicon oxide layer; forming a second spacer on sidewalls of the second polysilicon gate electrode structure and the high-k dielectric layer; and replacing the second polysilicon gate electrode structure with a metal gate electrode structure.

In some embodiments, a structure includes a first transistor formed on a first region of a semiconductor substrate, where the first transistor includes a silicon oxide gate dielectric; a polysilicon gate electrode disposed on the silicon oxide gate dielectric and having sidewall edges not aligned to sidewall edges of the silicon oxide gate dielectric; and a first spacer structure with inner sidewalls abutting the sidewall edges of the polysilicon gate electrode. The structure further includes a second transistor formed on a second region of the semiconductor substrate, where the second transistor is narrower than the first transistor and includes a high-k gate dielectric; a metal gate electrode disposed on the high-k gate dielectric so that sidewall edges of the metal gate electrode are aligned to sidewall edges of the high-k gate dielectric; and a second spacer structure abutting the sidewall edges of the metal gate electrode and the high-k gate dielectric.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a first transistor formed on a first region of a semiconductor substrate, wherein the first transistor comprises:
   a first source/drain region in the semiconductor substrate;
   a lightly doped region of the semiconductor substrate;
   a gate dielectric disposed above the semiconductor substrate;
   a polysilicon gate electrode disposed on the gate dielectric, wherein the gate dielectric is longer than the polysilicon gate electrode, and wherein an edge of the gate dielectric coincides with an edge of the lightly doped region; and
   a first spacer structure abutting a sidewall of the polysilicon gate electrode; and
   a second transistor having a length shorter than that of the first transistor and formed on a second region of the semiconductor substrate, wherein the second transistor comprises:
   a high-k gate dielectric;
   a metal gate electrode;
   a second spacer structure abutting sidewalls of the metal gate electrode and the high-k gate dielectric; and
   a second source/drain region substantially co-planar with the first source/drain region and in direct contact with a bottom surface of the second spacer structure.

2. The structure of claim 1, wherein the polysilicon gate electrode has a surface area between about 10 $\mu m^2$ and about 20 $\mu m^2$.

3. The structure of claim 1, wherein the polysilicon gate electrode has a center to edge thickness ratio of about 0.9.

4. The structure of claim 1, wherein widths of the polysilicon electrode and the metal gate electrode are substantially equal.

5. The structure of claim 1, wherein the metal gate electrode is taller than the polysilicon gate electrode by an amount substantially equal to a thickness difference between the gate dielectric and the high-k gate dielectric.

6. The structure of claim 1, wherein the gate dielectric is thicker than the high-k dielectric and comprises silicon oxide.

7. The structure of claim 1, further comprising a silicide layer on the polysilicon gate electrode, wherein the silicide layer and the polysilicon gate electrode have a substantially equal surface area.

8. The structure of claim 1, wherein the first transistor is configured to operate at about 5 V and the second transistor is configured to operate at about 1 V.

9. A structure, comprising:
   a first transistor formed on a first region of a semiconductor substrate, wherein the first transistor comprises:
   a first source/drain region having a lightly doped region;
   a silicon oxide gate dielectric disposed above the semiconductor substrate, wherein an edge of the silicon oxide gate dielectric coincides with an edge of the lightly doped region;
   a polysilicon gate electrode disposed on the silicon oxide gate dielectric, wherein the polysilicon gate electrode has a length shorter than that of the silicon oxide gate dielectric; and
   a first spacer structure with inner sidewalls abutting sidewall edges of the polysilicon gate electrode; and
   a second transistor formed on a second region of the semiconductor substrate, wherein the second transistor has a smaller surface area than that of the first transistor and comprises:
   a high-k gate dielectric;
   a metal gate electrode disposed on the high-k gate dielectric;
   a second spacer structure abutting sidewall edges of the metal gate electrode and the high-k gate dielectric; and
   a second source/drain region substantially co-planar with the first source/drain region and in physical contact with a bottom surface of the second spacer structure.

10. The structure of claim 9, wherein the first spacer structure has outer sidewall edges that coincide with the sidewall edges of the silicon oxide gate dielectric.

11. The structure of claim 9, wherein the polysilicon gate electrode has a surface area between about 10 $\mu m^2$ and about 20 $\mu m^2$. and a center to edge thickness ratio between about 0.9 and about 1.

12. The structure of claim 9, wherein the silicon oxide gate dielectric is thicker than the high-k gate dielectric.

13. The structure of claim 9, wherein the metal gate electrode is taller than the
   polysilicon gate electrode by an amount equal to a thickness difference between the silicon
   oxide gate dielectric and the high-k gate dielectric.

14. A structure, comprising:
   a first region of a substrate, wherein the first region comprises a polysilicon transistor structure that includes:
   a first source/drain region having a lightly doped portion;
   a gate dielectric disposed above the substrate, wherein an edge of the gate dielectric coincides with an edge of the lightly doped portion;
   a polysilicon gate electrode, on the gate dielectric; and
   a first spacer structure along a sidewall of the polysilicon gate electrode; and
   a second region of the substrate, wherein the second region comprises a metal transistor structure with a length shorter than that of the polysilicon transistor structure, and wherein the metal transistor structure comprises:

a high-k gate dielectric;

a metal gate electrode, on the high-k gate dielectric, with a sidewall that coincides with a sidewall of the high-k gate dielectric;

a second spacer structure, wherein a bottom surface of the second spacer structure is coplanar with a bottom surface of the high-k gate dielectric; and a second source/drain region substantially co-planar with the first source/drain region.

15. The structure of claim 14, wherein the first region further comprises a silicide layer on the polysilicon gate electrode, wherein the silicide layer and the polysilicon gate electrode have a substantially equal surface area.

16. The structure of claim 14, wherein the gate dielectric is thicker than the high-k gate dielectric and comprises silicon oxide.

17. The structure of claim 14, wherein the polysilicon gate electrode has a surface area between about 10 $\mu m^2$ and about 20 $\mu m^2$.

18. The structure of claim 14, wherein the polysilicon gate electrode has a center to edge thickness ratio of about 0.9.

19. The structure of claim 14, wherein the metal gate electrode is taller than the polysilicon gate electrode by an amount substantially equal to a thickness difference between the gate dielectric and the high-k gate dielectric.

20. The structure of claim 14, wherein:

the sidewalls of the metal gate electrode and the high-k gate dielectric are perpendicular to the substrate; and a length of the metal gate electrode between opposing portions of the second spacer structure is substantially equal to a length of the high-k gate dielectric between the opposing portions of the second spacer structure.

* * * * *

UNITED STATES PATENT AND TRADEMARK OFFICE
CERTIFICATE OF CORRECTION

PATENT NO. : 11,942,475 B2
APPLICATION NO. : 16/657396
DATED : March 26, 2024
INVENTOR(S) : Lin et al.

Page 1 of 1

It is certified that error appears in the above-identified patent and that said Letters Patent is hereby corrected as shown below:

In the Claims

In Column 12, Claim 11, Line 45, delete "$\mu m^2$." and insert -- $\mu m^2$ --, therefor.

Signed and Sealed this
Seventh Day of May, 2024

Katherine Kelly Vidal
*Director of the United States Patent and Trademark Office*